US005591313A

United States Patent [19]
Barber, Jr. et al.

[11] Patent Number: 5,591,313
[45] Date of Patent: Jan. 7, 1997

[54] APPARATUS AND METHOD FOR LOCALIZED ION SPUTTERING

[75] Inventors: Thomas A. Barber, Jr., Pawtucket; Lioudmila D. Kisterskaya; Leonid L. Kistersky, both of Providence, all of R.I.

[73] Assignee: Tabco Technologies, Inc., Pawtucket, R.I.

[21] Appl. No.: 496,888

[22] Filed: Jun. 30, 1995

[51] Int. Cl.$^6$ .................................................. C23C 14/34
[52] U.S. Cl. ........................ 204/192.12; 204/298.07; 204/298.11; 204/298.14; 204/298.23
[58] Field of Search ...................... 204/192.12, 298.07, 204/298.23, 298.06, 298.11, 298.14

[56] References Cited

U.S. PATENT DOCUMENTS

| | | | |
|---|---|---|---|
| 3,830,721 | 8/1974 | Gruen et al. | 204/298.07 |
| 4,094,764 | 6/1978 | Boucher et al. | 204/298.06 |
| 4,221,652 | 9/1980 | Kuriyama | 204/298.22 |
| 4,376,025 | 3/1983 | Zega | 204/192.12 |
| 4,395,323 | 7/1983 | Denton et al. | 204/298.19 |
| 4,412,906 | 11/1983 | Sato et al. | 204/298.07 |
| 4,466,876 | 8/1984 | Sakai et al. | 204/298.07 |
| 4,895,631 | 1/1990 | Wirz et al. | 204/192.13 |
| 4,946,576 | 8/1990 | Dietrich et al. | 204/298.06 |
| 4,965,248 | 10/1990 | Poppe et al. | 505/475 |
| 4,988,422 | 1/1991 | Wirz | 204/192.15 |
| 5,069,770 | 12/1991 | Glocker | 204/192.12 |
| 5,317,006 | 5/1994 | Kumar | 204/298.12 |
| 5,338,425 | 8/1994 | Mishima et al. | 204/298.12 |
| 5,346,601 | 9/1994 | Barada et al. | 204/192.15 |

OTHER PUBLICATIONS

Sovradio; Handbook of Thin Film Technology; 1977, pp. 356–363 (Russian Translation of Maissel Glang).
John A. Thornton and Alan S. Penfold; "Cylindrical Magnetron Sputtering", Chap. 11–2 of *Thin Film Processes* 1978; pp. 75–111, Academic Press, Inc.

*Primary Examiner*—Aaron Weisstuch
*Attorney, Agent, or Firm*—Salter & Michaelson

[57] ABSTRACT

An apparatus for localized ion sputtering consists of a vacuum chamber, an anode and cathode disposed in spaced relation in the vacuum chamber, a power supply for generating an electric field between the anode and cathode, and a means for directing a stream of plasma forming gas tangent to a target surface of the cathode. The anode has a first surface which is disposed in facing relation to the target surface of the cathode and further has an opposing second surface. The electric field which is generated between the anode and cathode has lines of force which extend generally perpendicular to the target surface of the cathode. In operation, the plasma forming gas is ionized adjacent to the target surface of the cathode by the electric field wherein the ions bombard the target surface of the cathode to strip away particles of cathode material. The particles are deposited onto a substrate which is positioned adjacent to the second surface of the anode. Embodiments are disclosed for sputtering planar surfaces, selected areas of planar surfaces, the inner and outer surfaces of elongate elements, including rods and tubes, and for coating the inner surfaces of openings in printed circuit boards. In one of the embodiments the gas is directed through a nozzle disposed tangent to the cathode target surface, while in other embodiments the gas is fed through a space formed between the anode and the cathode.

29 Claims, 5 Drawing Sheets

APPARATUS AND METHOD FOR LOCALIZED ION SPUTTERING

BACKGROUND OF THE INVENTION

This invention relates generally to ion sputtering devices, and more particularly to an improved apparatus and method for ion sputtering which are more efficient than the prior art devices and methods, and further which are capable of coating hard to reach places, such as the interior surfaces of pipes with small diameters, or interior surfaces of openings or holes.

Methods of ion sputtering utilizing glow discharge, and devices for carrying out these methods are well-known in the art. For example, U.S. Pat. No. 4,221,652 to Kuriyama, U.S. Pat. No. 4,376,025 to Zega, U.S. Pat. No. 4,395,323 to Denton et al., U.S. Pat. No. 4,412,906 to Sato et al., U.S. Pat. No. 4,895,631 to Wirz et al., U.S. Pat. No. 4,946,576 to Dietrich et al., U.S. Pat. No. 4,965,248 to Poppe et al., U.S. Pat. No. 4,988,422 to Wirz, U.S. Pat. No. 5,069,770 to Glocker, U.S. Pat. No. 5,317,006 to Kumar, U.S. Pat. No. 5,338,425 to Mishima et al., and U.S. Pat. No. 5,346,601 to Barada et al. are representative of the available prior art. Typically, such apparatuses include two electrodes, namely a cathode target of metallic or metallic alloy material which is to be deposited, such as a precious metal or precious metal alloy, and an anode which is located in spaced relation to the cathode. The electrodes are placed in a vacuum chamber which is pumped out continuously, and plasma forming gas is fed into the chamber. For flat or planar surfaces which are to be coated, planar cathode targets are used. Similarly, when the inner surface of a cylinder is to be coated, the cathode target is a rod which is disposed along an axis of the cylinder within the cylinder.

It has been found that each of the prior art devices suffers from the disadvantage of being inefficient in that a significant amount of sputtered material is not directed to the surface of the substrate to be coated. The sputtered material which does not deposit onto the substrate to be coated is evacuated from the chamber and is wasted. Another shortcoming of the prior art devices is that they are limited to a low current density on the cathode target of approximately ten to twenty amps per square meter. It has been found that when the pressure of the plasma forming gas is increased, the current density is also increased. However, when the current density and gas pressure increase in the prior art devices, a phenomenon known as "back sputtering" occurs in which the sputtered atoms travel back towards the cathode target.

One known solution to the operating disadvantages of the prior art is to use a high-efficiency magnetron sputtering device in which a magnetic system capable of generating a magnetic field is mounted on a side opposite to the target surface of the cathode. As a result of the interaction of the magnetic field and the electric field above the erosion zone of the cathode target surface, a localized tunnel zone of the working plasma with high ionization degree is formed. This generates relatively high current density on the cathode target, e.g., up to approximately 3000 amps per square meter.

Magnetron sputtering devices are widely used in the industry due to their high productivity, relative simplicity, and reliability. However, such devices are incapable of coating the inner surfaces of pipes and inner surfaces of holes having small diameters. The minimum possible diameters of pipes and holes that can be coated using magnetron sputtering devices is approximately fifty millimeters.

A sputtering deposition apparatus 10 illustrated in FIG. 1 represents one known technology developed to overcome many of these and other shortcomings of the prior art. In this apparatus, which is disclosed in Ukraine Patent No. 7111 to Dudko et al., there is provided an anode 12 and nozzle 14 disposed above a cathode target 16. The anode 12 is insulated from the nozzle 14 by a sleeve 15 of dielectric material. The arrangement is such that the nozzle 14 is directed towards the cathode target 16 along an axis A generally perpendicular to the plane of the cathode target 16. A substrate 18 to be coated lies along a plane generally perpendicular to the plane of the cathode target 16 and parallel to the axis A of the nozzle 14. A supply of plasma forming gas (see arrows 20), such as argon, is directed through the tip of the nozzle 14 toward the cathode target 16. An electric field (not shown) generated by the anode 12 and cathode target 16 within the gas flow 20 is effective to ionize the gas and form an ionized gas cloud (broken lines) 21 adjacent to the surface of the cathode target 16. High energy ions 22 within the gas cloud 21 bombard the surface of the cathode target 16 (see arrows 23) and cause individual atoms 24, or blocks of atoms of the cathode target material, to be stripped away from the cathode target 16. The individual stripped atoms 24 are not directed in any particular direction, but instead travel away from the cathode target in random directions, only some of which are directed toward the substrate 18 to be coated (see arrow 25). While this device is effective for its intended purpose, it has been found that many of the stripped atoms 24 never contact the substrate to be coated, and therefore there is still a significant amount of waste associated with this device.

SUMMARY AND OBJECTS OF THE INVENTION

There is thus a present need for an apparatus and method of ion sputtering which more directly precipitates particles stripped from the cathode target onto the substrate to be coated for increasing the efficiency of the process. There is further a need for such an apparatus and method which is capable of using the cathode target material for coating the inner surface of a small diameter tube and small diameter openings.

In general, the instant invention provides an apparatus for localized ion sputtering comprising a vacuum chamber, an anode and cathode disposed in spaced relation in the vacuum chamber, a power supply for generating an electric field between the anode and cathode, and a means for directing a stream of plasma forming gas tangent to a target surface of the cathode. More specifically, the cathode has a target surface which is disposed in spaced facing relation to a first surface of the anode. When an electrical voltage is supplied between the anode and cathode, an electric field is generated between the anode and cathode that has lines of force which extend generally perpendicular to the target surface of the cathode. In operation, the plasma forming gas, which is introduced tangent to the target surface of the cathode, is ionized adjacent to the target surface of the cathode by the electric field, whereby the ions bombard the target surface of the cathode and strip away particles of cathode material. The particles randomly travel away from the target surface and are deposited onto a substrate which is positioned adjacent to the second surface of the anode. The instant arrangement of the anode and cathode and the direction of gas flow tangent to the target surface of the cathode have been found to more efficiently deposit the stripped atoms onto the substrate to be coated.

A first preferred embodiment is disclosed for sputtering planar surfaces wherein the anode and cathode comprise planar members disposed in parallel facing relation. A nozzle with an elongate slit-shaped opening is positioned between the anode and cathode and is operative for directing a stream of plasma forming gas tangent to the target surface of the cathode. A substrate having a planar surface to be coated is positioned above the second surface of the anode in generally parallel relation to the target surface of the cathode and is moved in a linear direction to achieve a coating over the entire surface of the substrate.

A second preferred embodiment is disclosed for sputtering the inside surface of a tube. The cathode comprises an inner rod wherein the outer surface of the rod is the target surface and an outer tubular anode which is disposed in spaced concentric relation with the rod. The inner surface of the anode is provided with a dielectric insulating layer. The plasma forming gas is supplied through the space formed between the target surface of the cathode and the dielectric layer of the anode. The assembly is concentrically, linearly moved inside the tube to be coated, whereby particles liberated from the cathode are deposited onto the inner surface of the tube.

A third preferred embodiment is disclosed for sputtering the outside surface of an elongate cylinder. The anode and cathode comprise inner and outer concentric tubes maintained in spaced concentric relation. The outer surface of the anode is provided with a layer of dielectric material. The plasma forming gas is supplied through the space formed between the target surface of the cathode and the dielectric layer of the anode. The assembly is concentrically, linearly moved along the outside of the tube to be coated, whereby particles stripped from the cathode are deposited onto the outer surface of the tube.

Still another embodiment is disclosed for sputtering a selected area on a planar substrate. The anode and cathode comprise planar elements that are assembled as an integral unit in parallel facing relation with a layer of dielectric material positioned therebetween. In this embodiment, the cathode target surface is provided by a separate sheet of cathode target material disposed beneath the cathode. The cathode and anode assembly includes at least one opening therein to expose at least one selected surface area of a substrate located above the anode to the sputtering process. The plasma forming gas is fed through a space formed between the lower surface of the cathode and the cathode target sheet. The gas is ionized in the area of the opening, whereby particles stripped away from the cathode target travel through the opening onto the selected surface area of the substrate located above the anode, for example a circle, rectangle, or other shape.

Still further yet, another embodiment is disclosed for coating the inner surface of openings in a foiled printed circuit board. The cathode comprises a planar member having a target surface, and the foils on both sides of the printed circuit board comprise the anode. The foiled anode surface facing the target surface of the cathode, has an insulating layer of dielectric material. The foil anode and insulation layer include corresponding connection holes. The plasma forming gas is directed through the space formed between the adjacent cathode and dielectric layer on the lower foil anode, and the gas is ionized in the area of the opening, whereby particles stripped away from the cathode target travel through the opening onto the side surfaces of the openings in the circuit board.

Still another embodiment is disclosed for coating the inner surfaces of connecting holes in a non-foiled printed circuit board. The cathode comprises a planar member having a target surface. The anode is also a planar member disposed above the printed circuit board. The plasma forming gas is directed through the space formed between the adjacent printed circuit board and the target surface of the cathode, and is ionized in the area of the connecting holes, whereby particles of sputtered material from the cathode target travel through the connecting holes onto the side surfaces of the holes.

Accordingly, among the several objects of the present invention are the provision of an apparatus and method for localized ion sputtering which are capable of directing sputtered particles towards a substrate to be coated; the provision of such an apparatus and method for localized ion sputtering which are capable of coating the inner surfaces of cylinders having small diameters; the provision of such an apparatus and method for localized ion sputtering which are capable of coating the outer surfaces of cylindrical members; the provision of such an apparatus and method for localized ion sputtering which are capable of coating substrates having small openings; the provision of such an apparatus and method for localized ion sputtering which substantially eliminate the waste of ionized cathode material; and the provision of such an apparatus and method for localized ion sputtering which produce a finished product having a high quality finish, for example coated connective holes of a printed circuit board.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention.

DETAILED DESCRIPTION OF THE PREFERRED EMBODIMENTS

Figure 1:
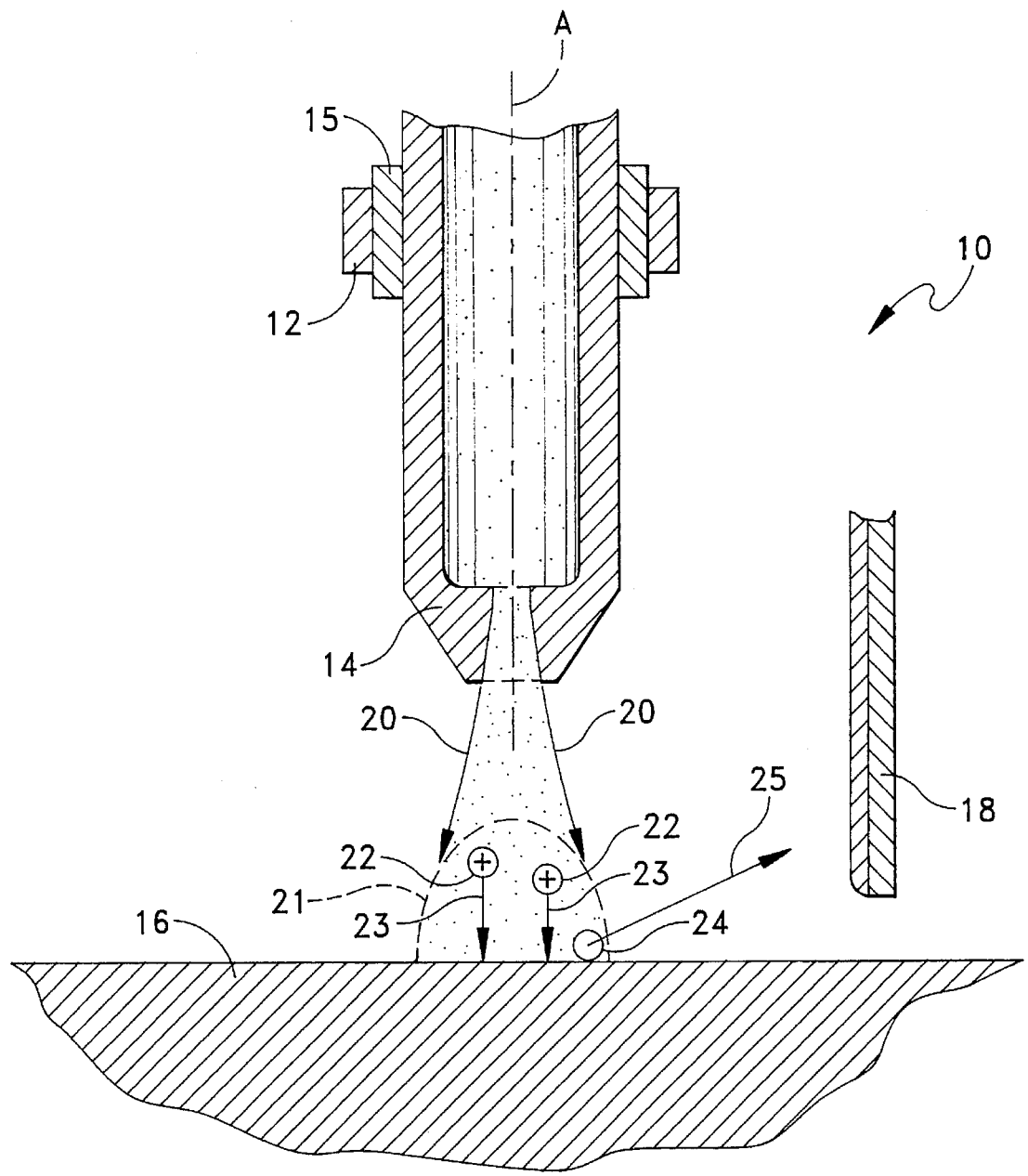
FIG. 1 is a cross-sectional, elevational view of a prior art apparatus for ion sputtering.
Figure 2:
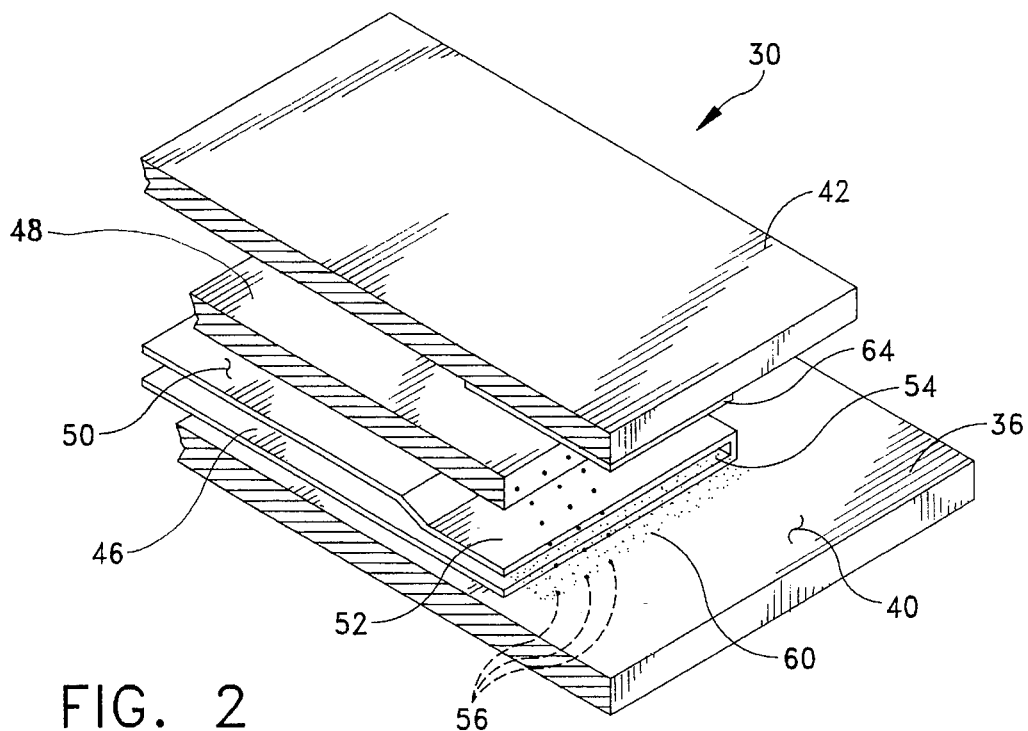
FIG. 2 is a perspective, cross-sectional view of an apparatus for localized ion sputtering of the present invention.
Figure 3:
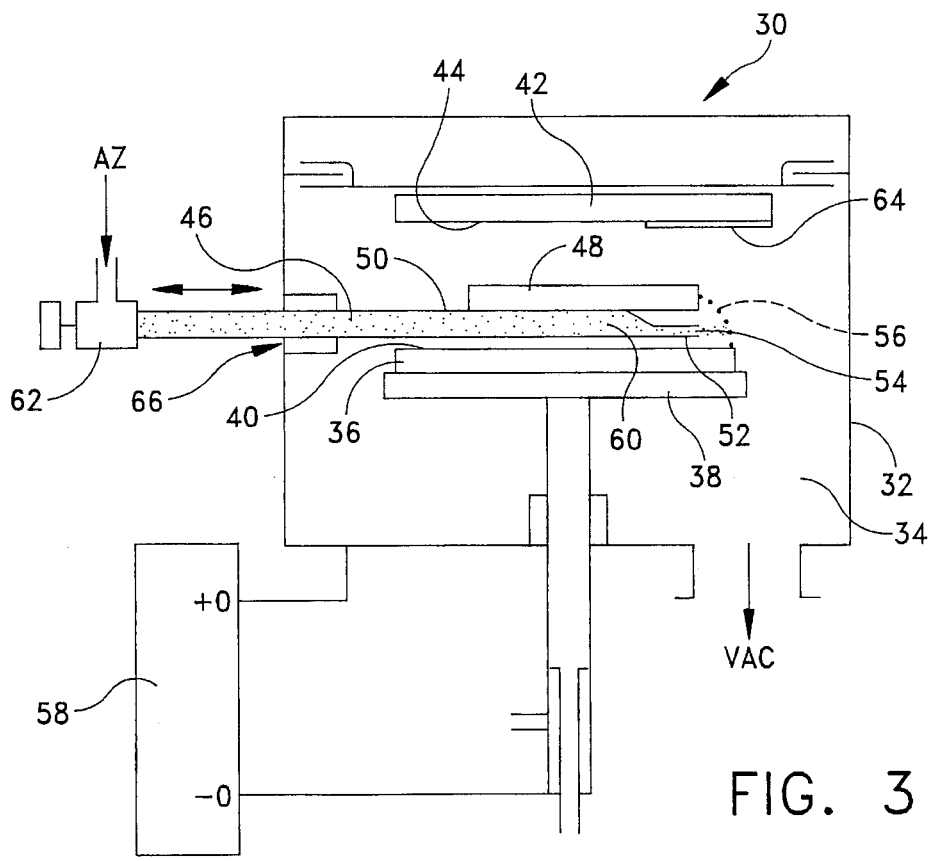
FIG. 3 is a schematic elevational view of the apparatus illustrated in FIG. 2.

Referring now to the drawings, and more particularly to FIGS. 2 and 3, there is generally indicated at 30 an apparatus for localized ion sputtering of the present invention. As shown, the apparatus 30 comprises a housing 32 defining a vacuum chamber 34 in which the sputtering operation of the present invention takes place. Preferably, the pressure in the vacuum chamber 34 is between $4\times10^{-4}$ to $4\times10^{-7}$ inch of mercury. A sheet of cathode target material 36 is disposed within the vacuum chamber 34 by a pair of supports 38. The sheet of cathode material 36 has an upwardly facing target surface 40 from which coating material is supplied. Depending on the material to be coated, the sheet of cathode material 36 can be fabricated from any number of metallic materials, such as metals and metal alloys.

A substrate 42 is disposed within the vacuum chamber 34 along a plane generally parallel to the plane of the sheet of cathode target material 36. The substrate 42 has a downwardly facing surface 44 which faces the upwardly facing surface 40 of the sheet of cathode target material 36. The downwardly facing surface 44 of the substrate 42 receives the coating material from the sheet of cathode target material 36 as a result of the sputtering procedure.

Also disposed within the vacuum chamber 34 is a nozzle 46 which is positioned between the sheet of cathode target material 36 and the substrate 42. The nozzle 46 includes an anode 48 mounted on its upper surface 50 so that the anode 48 is disposed within the vacuum chamber 34 between the sheet of cathode target material 36 and the substrate 42. The nozzle 46 further includes a linearly-shaped tip portion 52 having a slit or opening 54 formed therein with a widthwise dimension between 0.01 and 1.0 millimeter. The tip portion 52 of the nozzle 46 is spaced from the sheet of cathode target material 36 a distance no less than the minimum widthwise dimension of the slit 54 (i.e., no less than 0.01 and 1.0 millimeter). As shown, the nozzle 46 is oriented within the vacuum chamber 34 along a plane generally parallel to the planes of the sheet of cathode target material 36 and the substrate 42. The anode 48 also lies along a parallel plane.

Still referring to FIGS. 2 and 3, the arrangement of the apparatus 30 is such that when applying a positive charge to the anode 48 and a negative charge to the sheet of cathode target material 36, an electric field represented by lines 56 is generated between the anode 48 and the sheet of cathode target material 36. As shown, the electric field 56 extends along a plane generally perpendicular to the planes of the sheet of cathode target material 36, the nozzle 46, and the anode 48. A suitable power source 58 generates the electric field 56 between the sheet of cathode target material 36 and the anode 48.

Importantly, the nozzle 46 is located within the vacuum chamber 34 in a position generally tangent to the surface of the sheet of cathode target material 36 and generally perpendicular to the electric field 56 extending between the sheet of cathode target material 36 and the anode 48. This arrangement enables the nozzle 46 to discharge a stream of plasma forming gas 60 tangent to the target surface 40 of the sheet of cathode target material 36. The flow of gas 60 through the slit 54 of the nozzle 46 is controlled by a flow regulator 62 in fluid communication with the nozzle 46. Preferably, the plasma forming gas 60 comprises argon which is well-known in the art of ion sputtering. Once exhausted through the nozzle 46, the stream of plasma forming gas 60 is ionized by the electric field in the linear area near the top portion of the nozzle 46, and high energy ions from the ionized gas bombard the cathode target material 36. More specifically, the high energy ions are accelerated in the electrical field 56 towards the sheet of cathode target material 36 and bombard the sheet 36 stripping out the atoms, or groups of atoms of cathode material.

The stripped atoms randomly travel from the target surface 40 of the cathode towards the surface 44 of the substrate 42 for forming a coating 64 on the substrate.

Support and adjusting means, generally indicated at 66 in FIG. 3, supports the nozzle 46 within the vacuum chamber 34. Means 66 is also capable of adjusting the gap between the nozzle 46 and the sheet of cathode target material 36. This may be accomplished in a many number of ways such as by a pivoting device which enables the nozzle 46 to pivot and move the tip portion 52 towards and away from the sheet of cathode target material 36 and to lock the nozzle 46 in place in a desired position. Also, a suitable device (not shown) is embodied in the apparatus 30 for providing relative movement between the substrate 42 and sheet of cathode target material 36, and the nozzle 46 and anode 48. This may be accomplished by having either the substrate 42 and the sheet of cathode target material 36 move linearly with respect to the stationary nozzle 46 and anode 48, or by having the nozzle 46 and anode 48 move linearly with respect to the stationary substrate 42 and sheet of cathode target material 36. Such moving means is well-known in the art.

It should be noted that the apparatus 30 of the present invention is far more efficient than the aforementioned prior art devices since the sputtered material is, for the most part, directed towards the substrate 42 rather than randomly contacting the substrate. As can be appreciated from viewing the arrangement, the directions of travel of the stripped atoms from the target surface 40, for the most part, have a component of motion which directs them toward the substrate. Accordingly, the near maximum of intensity for the stream of sputtered material is directed towards the surface 44 of the substrate 42 and a near minimum quantity of sputtered material is evacuated from the vacuum chamber 34 with the remainder of the stream of plasma forming gas 60. The apparatus 30 of the present invention is capable of localizing the sputtered area in the nearest location of the tip portion 52 of the nozzle 46. Moreover, since the distance between the nozzle 46 and the cathode target material 36 is relatively small, the current density in the sputtered area can be dramatically increased, e.g., to approximately 50,000 amperes per square meter.

During operation of apparatus 30, the method of the present invention is as follows. The vacuum chamber 34 is pumped out to achieve the required pressure between $4\times10^{-4}$ and $4\times10^{-7}$ inch of mercury. The dimension of the nozzle slit 54 can be chosen from 0.01 to 1.0 millimeter. A plasma forming gas, such as argon, is fed through the nozzle 46 via the flow regulator 62 in a direction tangent to the upwardly facing target surface 40 of the sheet of cathode target material 36. A new value of pressure is established in the zone nearest the tip portion 52 of the nozzle 46 (e.g., between 60 to 600 Pa). Upon energizing the power source 58 and generating the electric field 56, the localized gas discharge 60 under the nozzle 46 creates intensive ion sputtering of the local linear zone of the sheet of cathode target material 36 which is directed forward the downwardly facing surface 44 of the substrate 42 for coating the substrate 42 with layer 64.

The local increase in the gas pressure adjacent the slit 54 of the nozzle 46 reaches up to 60 to 600 Pa in the zone near the sheet of cathode target material 36 allows the current density to the target to increase sharply to approximately 50,000 amps per square meter. It is possible to regulate the local pressure near the sheet of cathode target material 36 by changing the flow amount of gas 60 from the nozzle 46 via regulator 62 for obtaining the fine regulation of power of discharge and current density on the sheet of cathode target material 36. For a constant dimension of the slit 54 of the nozzle 46 and the voltage between the sheet of cathode target material 36 and the anode 48, by increasing gas flow from 0.1 to 1.0 Pa. cubic meters per second, it is possible to obtain a power increase of approximately more than one hundred times greater than that experienced in prior art apparatuses.

Figure 4:
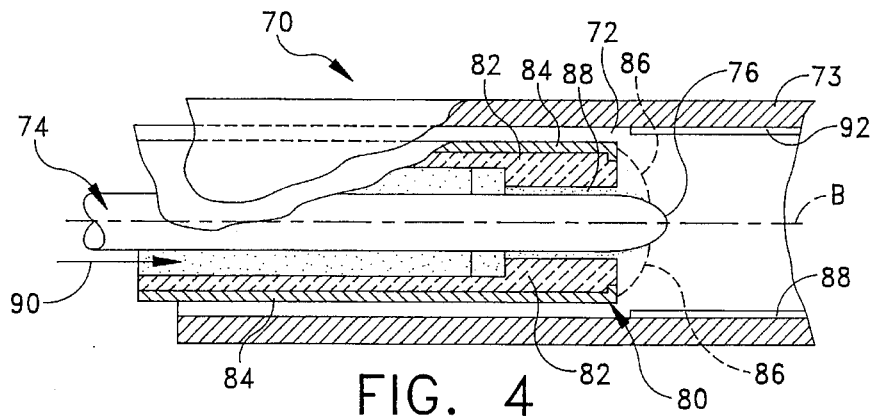
FIG. 4 is a cross-sectional, elevational view of an apparatus for ion sputtering of another preferred embodiment especially suited for coating the inner surfaces of cylinders.

Referring now to FIG. 4, there is generally indicated at 70 an apparatus which is especially suited for coating the interior surface 72 of a tube or pipe 73. More specifically, apparatus 70 comprises a rod-shaped cathode generally indicated at 74 disposed within a vacuum chamber (not shown). The cathode 74 is disposed along an axis B, and has an outer target surface 76 for supplying coating material to be sputtered. The pipe 73 is disposed within the vacuum chamber along the axis B with the rod of cathode target material 74 being disposed concentrically therein so that the outer surface 76 of the cathode 74 faces the inner surface 72 of pipe 73.

Apparatus 70 further comprises an outer tubular anode assembly generally indicated at 80 which is concentrically disposed around the cathode rod 74 but inside the pipe 73. The anode assembly 80 comprises an inner layer 82 of a dielectric material which faces the target surface 76 of the cathode 74, and an outer conductive layer 84 which faces the inner surface 72 of the pipe 73. As shown, the anode assembly 80 is in relatively close concentric proximity to the cathode rod 74 so that when an electric field 86 is generated between the outer anode layer 84 and the cathode rod 74, the electric field lines 86 extend radially outwardly from the axis B in a direction generally towards the outer surface 84 of the anode assembly 80.

The outer target surface 76 of the cathode and the inner dielectric layer 82 of the anode cooperate to form a tubular nozzle for providing a stream of plasma forming gas 88 generally tangent to the target surface 76 of the cathode 74 and perpendicular to the electric field 86 (see also arrow 90 indicating entry of the gas stream into the anode/cathode assembly) whereby the gas is ionized and bombards the cathode rod 74. The sputtered material resulting from ion bombardment is directed towards the inner surface 72 of the pipe 73. This process applies a coating 92 on the inner surface 72 of the pipe 73.

In operation, the cathode rod 74, anode assembly 80, and pipe 73 are disposed in the manner illustrated in FIG. 4. An electric field 86 is generated between the anode 80 and the cathode rod 74, and the anode/cathode assembly is linearly, concentrically moved with respect to the inner surface 72 of the pipe 73 to deposit a coating 92.

Figure 5A:
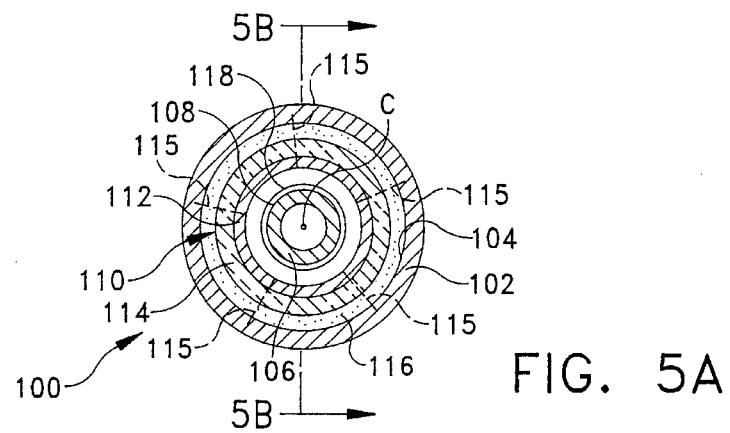
FIG. 5A is a cross-sectional, end view of an apparatus for ion sputtering of yet another preferred embodiment especially suited for coating the outer surfaces of cylinders.
Figure 5B:
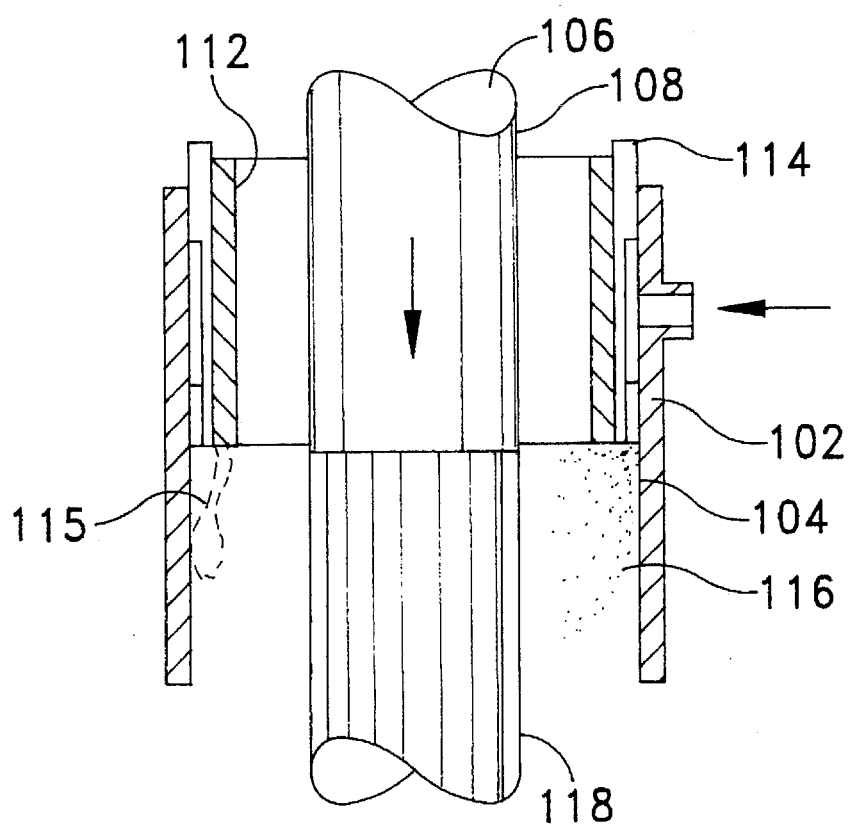
FIG. 5B is a cross-sectional view thereof taken along line 5B—5B of FIG. 5A.

Turning now to FIGS. 5A and 5B, there is generally indicated at 100 an apparatus especially suited for coating the exterior surface of a cylindrically-shaped article, e.g., a rod or pipe. More specifically, apparatus 100 comprises a cylindrical cathode 102 disposed within a vacuum chamber (not shown) along an axis C and has an inner target surface 104 for supplying coating material. A cylindrical substrate 106 (e.g., the rod or pipe) is disposed along the axis C concentrically within the cathode 102. The substrate 106 has an outer surface 108 generally facing the inner target surface 104 of the cathode 102.

The apparatus further comprises a cylindrical anode assembly 110 comprising an inner layer 112 formed of conductive material, and an outer layer 114 formed of dielectric material. The anode assembly 110 is disposed in concentric spaced relation to the cathode 102 so that when an electric field 115 (broken lines) is generated between the anode 110 and cathode 102, the electric field lines 115 extend radially inwardly in a direction generally towards the outer surface 108 of the substrate 106.

The outer dielectric layer 114 of the anode 110 and the inner surface 104 of the cathode 102 cooperate to define a tubular nozzle effective for directing a stream of plasma forming gas 116 in a direction generally tangent to the surface 104 of the cathode 102 and perpendicular to the electric field lines 112.

In operation, the stream of plasma forming gas 116 is discharged between the anode 110 and the cathode 102 and the electric filed 112 is generated, resulting in ion bombardment of the cathode target surface 104, further resulting in sputtered material being stripped from the cathode 102 and directed to the outer surface 108 of the substrate 106 thereby coating the outer surface 108 of the substrate 106 with the sputtered material as indicated by layer 118.

Figure 6:
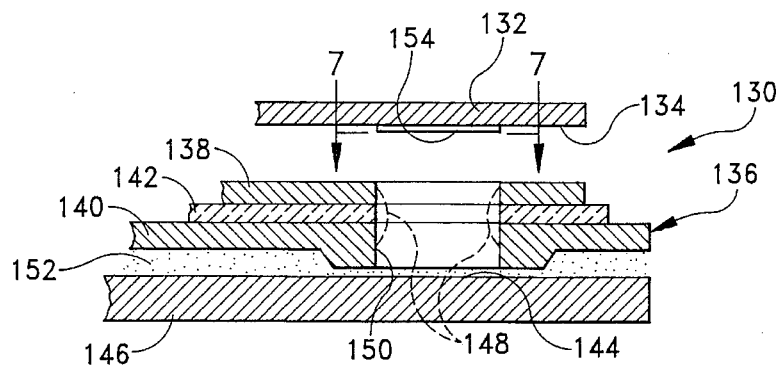
FIG. 6 is a cross-sectional, elevational view of an apparatus for ion sputtering of a further preferred embodiment especially suited for focusing ion sputtered material on a substrate.
Figure 7A:
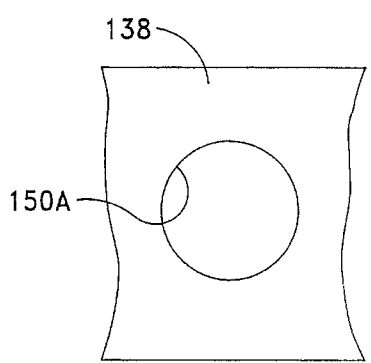
FIGS. 7A and 7B are two embodiments of a cross section taken along line 7—7 of FIG. 6.
Figure 7B:
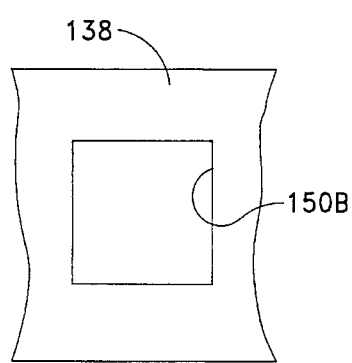

Referring to FIGS. 6 and 7, there is generally designated at 130 a modified apparatus generally similar in configuration to the apparatus 30 illustrated in FIGS. 2 and 3. Apparatus 130 is especially suited for focusing ion sputtered material onto a selected surface area of a planar member. As shown, a substrate 132 having a downwardly facing surface 134 to be coated is disposed over an anode/cathode assembly generally indicated at 136. The assembly 136 comprises an upper planar anode member 138, and lower generally planar cathode member 140 which are separated by a layer 142 of dielectric material. One major difference in the instant embodiment is that the cathode target surface 144 is provided by a sheet of cathode target material 146 disposed underneath the assembly 136, and in this connection it is noted that the cathode target 146 also comprises an integral portion of the cathode. When applying power to the anode 138 and cathode 140/146, an electric field represented by lines 148 (broken lines) is generated. It should be understood that the foregoing components of apparatus 130 are suitably housed within a vacuum chamber in the same manner as devices 30, 70, and 130.

The cathode and anode assembly 136 includes at least one opening 150 therein to expose at least one selected surface area of the 132 substrate located above the anode 138 to the sputtering process. The plasma forming gas 152 is fed through a space formed between the lower surface of cathode member 140 and the cathode target sheet 146. The gas is ionized in the area of the opening 150, whereby particles stripped away from the cathode target 146 travel through the opening 150 onto the selected surface area of the substrate 132 located above the anode 138 to form a coating 154. During operation of apparatus 130, material precipitated from the cathode target 146 is deposited on the surface of the substrate 132 in accordance with the shape of the opening 150. For example, for the circular-shaped opening 150A illustrated in FIG. 7A, would result in a circular shaped coated area 154 on the substrate 132. Similarly, for the rectangular-shaped opening 150B illustrated in FIG. 7B, the shape of the coating 146 on the substrate 132 is rectangular. It should be understood that the shape of the opening 144 can take the form of any desired shape for obtaining shaped localized coatings.

Figure 8A:
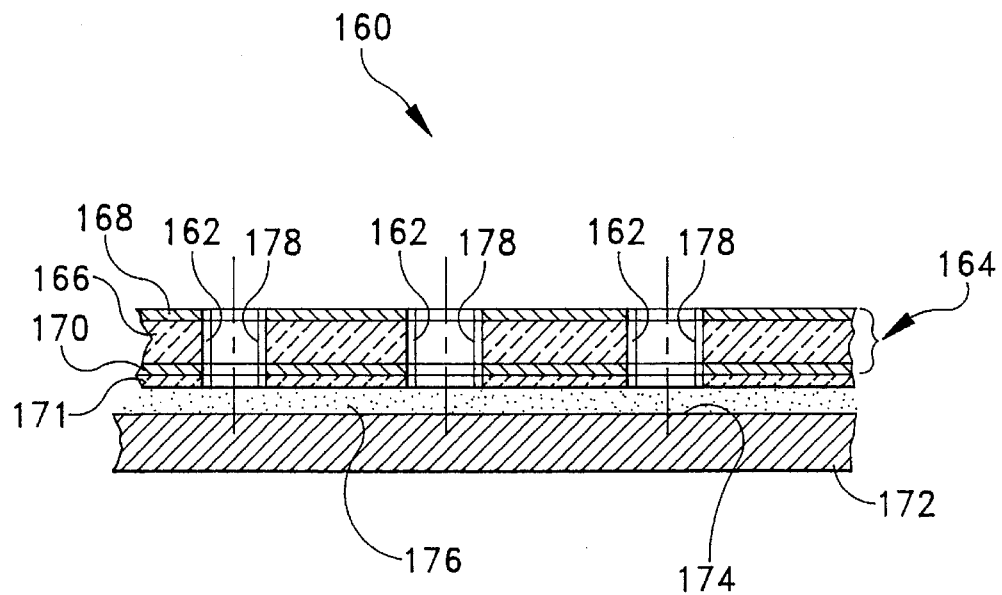
FIG. 8A is a cross sectional view of apparatus effective for coating the inner surfaces of connecting holes on a foiled printed circuit board.

Turning now to FIG. 8A, there is generally indicated at 160 an apparatus representing an embodiment of the present invention for coating small openings, such as connecting holes 162 in a foiled printed circuit board assembly generally indicated at 164. The foiled printed circuit board assembly 164 comprises an inner dielectric substrate 166 and upper and lower layers of foil 168, 170, respectively. The printed circuit board assembly 164 is further provided with a layer of dielectric material 171, such as Teflon, or polymide on the lower foil layer 170. The dielectric layer 171 includes openings corresponding with holes 162 so that the inner surface of the holes 162 are directly exposed to the sputtering process. The apparatus further comprises a cathode 172 with target surface 174, and in this case, the anode comprises the upper and lower foil layers 168, 170 of the printed circuit board assembly 164. A stream of plasma forming gas 176 is introduced within the narrow slit-like space between the dielectric layer 171 and target surface 174 of the cathode 172 for sputtering material from the cathode 172. The gas 176 is ionized in the area of the holes 162 such that the sputtered material travels through and onto the inner surfaces of the openings 162 to obtain a coating 178.

Figure 8B:
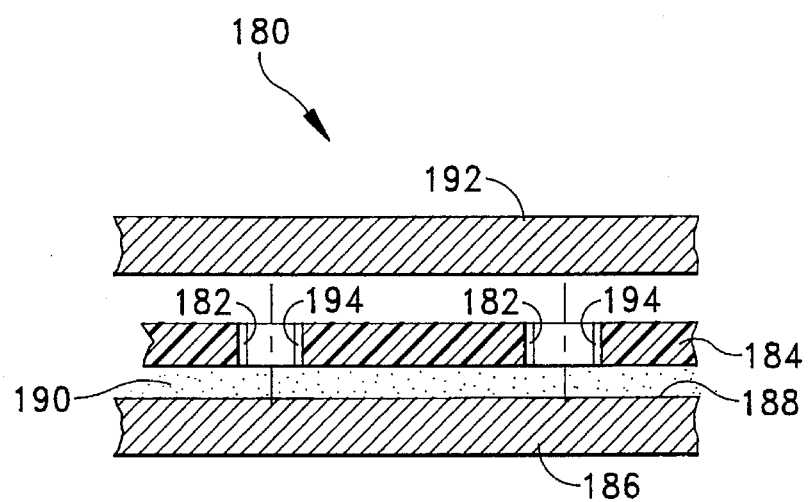
FIG. 8B is a similar cross-sectional view of apparatus effective for coating the inner surfaces of connecting holes of a non-foiled printed circuit board.

Referring to FIG. 8B, yet another embodiment 180 is operative for coating the inner surfaces of holes 182 in a non-foiled plastic substrate 184, such as the base of a printed circuit board. The apparatus 180 comprises a cathode 186 with a target surface 188. The substrate 184 is mounted in closely spaced parallel relation to the target surface 188 (0.1 mm–1 mm) forming a narrow space, or slit, for introducing a stream of plasma forming gas 190 between the substrate 184 and the target surface 188 of the cathode 186. A planar anode 192 is mounted above the substrate 184. Gas 190 is ionized in the area of the opening 182 such that sputtered material travels through the openings 182 to obtain a coating 194 on the inner surfaces of the openings 182.

The devices 160 and 180 of FIGS. 8A and 8B operate along the same principles as the foregoing apparatuses 30, 70, 100, and 130 for forming layers of coating on the inner surfaces of the openings.

Thus, it should be observed that the general operation of devices 30, 70, 100, 130, 160, and 180 are substantially similar to one another. Devices 30 and 130 are constructed for respectively applying coating material onto a generally planar surface or a selected area of a planar surface, whereas apparatuses 70, 100 are designed for coating the interior and exterior surfaces of tubular and cylindrical members, respectively. Moreover, devices 160, and 180 are operative for coating the inner surface of openings in a substrate, such as a circuit board. However, the one common principle shown in each design is that the electric field generated between the anode and cathode target material is generally perpendicular to the cathode target material, and that the direction of flow of the plasma forming gas is generally tangent to the target surface of the cathode.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An apparatus for localized ion sputtering, comprising:
   a vacuum chamber;
   an anode and a cathode disposed in spaced relation in said vacuum chamber, said cathode having a target surface for supplying a coating material, said anode having a first surface which is disposed in facing relation to the target surface of said cathode, said anode further having an opposing second surface, said anode comprising upper and lower foil layers of a foiled printed circuit board disposed in the vacuum chamber with the lower foil layer in parallel facing relation to the target surface of the cathode, said foiled printed circuit board further including a plurality of connecting holes having inner surfaces which are to be coated, said foiled printed circuit board being provided with a layer of dielectric material disposed over said lower foil layer, said layer of dielectric material having a plurality of openings corresponding to said connecting holes such that the inner surfaces of said connecting holes are exposed directly to the sputtering process;
   power supply means for generating an electric field between said anode and cathode, said electric field having lines of force which extend generally perpendicular to the target surface of the cathode; and
   means for directing a stream of plasma forming gas generally tangent to the target surface of the cathode and perpendicular to the lines of force, said plasma forming gas being ionized adjacent to the target surface of the cathode and bombarding the target surface of the cathode to strip away particles of cathode material, said stream of plasma forming gas being directed through the space formed between the target surface of the cathode and the layer of dielectric material whereby the plasma forming gas is ionized in the area of the connecting holes and sputtered material travels through said holes onto the inner surfaces of said holes to obtain a coating.

2. An apparatus for localized ion sputtering, comprising:
   a vacuum chamber;
   an anode and a cathode disposed in spaced relation in said vacuum chamber, said cathode having a target surface for supplying a coating material, said anode having a first surface which is disposed in facing relation to the target surface of said cathode, said anode further having an opposing second surface;
   a non-foiled printed circuit board disposed between the cathode and anode adjacent to the target surface of the cathode, said circuit board having a plurality of openings, said openings having inner walls which are to be coated;
   power supply means for generating an electric field between said anode and cathode, said electric field having lines of force which extend generally perpendicular to the target surface of the cathode; and
   means for directing a stream of plasma forming gas generally tangent to the target surface of the cathode and perpendicular to the lines of force, said plasma forming gas being ionized adjacent to the target surface of the cathode and bombarding the target surface of the cathode to strip away particles of cathode material, said plasma forming gas being directed through the space formed between a lower surface of said printed circuit board and the target surface of the cathode whereby the gas is ionized in the area of the openings, and sputtered material travels through the openings onto the inner surfaces, whereby a coating is obtained on said inner surfaces of said openings.

3. A method for localized ion sputtering in a vacuum using bombardment of a cathode target, comprising the steps of:
   disposing an anode and a cathode in closely spaced adjacency in a vacuum chamber, said cathode including a target surface, said anode having a leading edge which is positioned over a localized area of said target surface;
   evacuating said vacuum chamber;

generating an electric field between the anode and the cathode whereby lines of force of the electric field are concentrated between the leading edge of the anode and the localized area of the target surface; and creating a localized concentration of a plasma forming gas over said localized area of said target surface, said plasma forming gas having a localized pressure of between about 60 Pa to about 600 Pa in said localized area, whereby a localized ion current of up to about 50,000 Amperes per square meter is obtained in the localized area.

4. The method of claim 3 wherein said stream of plasma forming gas is provided through a nozzle at a flow rate between about 0.1 Pa cubic meters per second and about 1.0 Pa cubic meters per second.

5. The method of claim 4 further comprising the step of adjusting the flow rate of the plasma forming gas to establish a maximum ion current density within the localized area.

6. The method of claim 4 further comprising the step of adjusting the position of the nozzle relative to the target surface while maintaining a constant gas flow to establish a desired ion current density within the localized area.

7. Apparatus for localized ion sputtering in a vacuum, comprising:

an anode and cathode disposed in closely spaced adjacency in said vacuum chamber, said cathode having a target surface, said anode having a first surface which faces said target surface of said cathode, and an opposing second surface, said anode including a layer of dielectric material disposed on said first surface, said anode further having a leading edge which is positioned over said target surface;

power supply means for generating an electric field between said anode and said cathode, said electric field having lines of force extending between the leading edge of said anode and a localized area of said target surface immediately adjacent to said leading edge of said anode;

a plasma forming gas nozzle disposed between said anode and said target surface for directing a stream of plasma forming gas onto the target surface, said nozzle having an outlet which is positioned adjacent to the localized area of the target surface for establishing a localized concentration of a plasma forming gas over said localized area, said outlet comprising a thin slit-shaped tip portion which is operative for creating an increased localized pressure of said plasma forming gas of between about 60 Pa to about 600 Pa within said localized area; and means for moving a substrate to be coated adjacent to the second surface of said anode whereby sputtered material is received from said target surface onto the moving substrate adjacent to the leading edge of said anode.

8. The apparatus of claim 7 wherein said tip portion of said nozzle has a width of between about 0.01 mm to about 1.0 mm.

9. The apparatus of claim 8 wherein said tip portion of said nozzle is spaced between about 0.01 mm to about 1.0 mm away from said localized area of the target surface.

10. The apparatus of claim 7 wherein said tip portion of said nozzle is spaced between about 0.01 mm to about 1.0 mm away from said localized area of the target surface.

11. The apparatus of claim 7 further comprising means for adjusting the spacing between the tip portion of the nozzle and the target surface.

12. The apparatus of claim 7 further comprising means for adjusting the flow of gas through said nozzle.

13. Apparatus for localized ion sputtering to coat a surface of a generally planar object, comprising:

a vacuum chamber;

a planar anode and a planar cathode disposed in closely spaced parallel facing relation in said vacuum chamber, said cathode having a target surface, said anode having a first surface which faces said target surface of said cathode, and an opposing second surface, said anode further having a linear leading edge which is positioned over said target surface;

power supply means for generating an electric field between said anode and cathode, said electric field having lines of force extending between the leading edge of said anode and a linear localized area of said cathode target immediately adjacent to said linear leading edge of said anode;

a plasma forming gas nozzle disposed between said anode and target surface for directing a stream of plasma forming gas onto the target surface, said nozzle having a linear slit-shaped tip which is positioned immediately adjacent to said linear localized area of the target surface for establishing a localized concentration of a plasma forming gas over said linear localized area, said nozzle being operative for creating an increased localized pressure of said plasma forming gas of between about 60 Pa to about 600 Pa within said localized area; and means for moving a substrate to be coated adjacent to a second surface of said anode.

14. The apparatus of claim 13 wherein said tip of said nozzle has a width of between about 0.01 mm to about 1.0 mm.

15. The apparatus of claim 14 wherein said tip of said nozzle is spaced between about 0.01 mm to about 1.0 mm away from the target surface.

16. The apparatus of claim 13 wherein said tip of said nozzle is spaced between about 0.01 mm to about 1.0 mm away from the target surface.

17. The apparatus of claim 13 further comprising means for adjusting the spacing between the tip of the nozzle and the target surface.

18. The apparatus of claim 13 wherein said nozzle is secured to the first surface of said anode to form an anode/nozzle unit with the leading edge of the anode and the tip portion of the nozzle positioned in closely spaced adjacency, said apparatus further comprising means for adjusting a longitudinal position of said unit relative to the target surface.

19. Apparatus for localized ion sputtering to coat the inside surface of a tubular member, comprising:

a vacuum chamber;

a rod-shaped cathode coaxially disposed in spaced concentric relation inside a tubular anode, said anode and cathode being disposed inside said vacuum chamber, said cathode having an outer target surface, said anode having an inner surface which faces the target surface of said cathode, and an opposing outer surface, of electrically conductive material, said anode including a layer of dielectric material attached to the inner surface thereof, said anode including an annular leading edge which is positioned over said target surface;

power supply means for generating an electric field between said anode and cathode, said electric field having lines of force which extend between the leading edge of said anode and a localized area of said cathode target immediately adjacent to the annular leading edge of the anode;

an annular plasma forming gas nozzle formed by a space between said layer of dielectric material on said anode and said target surface of said cathode for directing a stream of plasma forming gas onto the target surface, said nozzle having a thin slit-shaped outlet which is positioned immediately adjacent to said localized area of the target surface for establishing a localized concentration of a plasma forming gas over said localized area, said nozzle being operative for creating an increased localized pressure of said plasma forming gas of between about 60 Pa to about 600 Pa within said localized area; and means for moving a tubular member the inner surface of which is to be coated within to the anode when said anode and cathode are received within said tubular member.

20. The apparatus of claim 19 wherein said outlet of said nozzle has a width of between about 0.01 mm to about 1.0 mm.

21. The apparatus of claim 19 further comprising means for adjusting the longitudinal position of the leading edge of the anode relative to the target surface.

22. The apparatus of claim 19 further comprising means for adjusting the flow of gas through said nozzle.

23. Apparatus for localized ion sputtering to coat the outside surface of an elongated member, comprising:

a vacuum chamber;

a tubular anode coaxially disposed within a tubular cathode, said anode and said cathode being disposed in said vacuum chamber, said cathode having an inner target surface, said anode having a first outer surface which faces the target surface of the cathode, and an opposing inner surface made of electrically conductive material, said anode including a layer of dielectric material disposed on said outer surface, said anode further having an annular leading edge which is positioned over said target surface;

power supply means for generating an electric field between said anode and cathode, said electric field having lines of force which extend between the leading edge of said anode and a localized area of said cathode target immediately adjacent to the annular leading edge of the anode;

an annular plasma forming gas nozzle formed by a space between said outer layer of dielectric material on said anode and said inner target surface of said cathode for directing a stream of plasma forming gas onto the target surface, said nozzle having an annular outlet which is positioned immediately adjacent to said localized area of the target surface for establishing a localized concentration of a plasma forming gas over said localized area, said nozzle being operative for creating an increased localized pressure of said plasma forming gas of between about 60 Pa to about 600 Pa within said localized area; and means for moving an elongated member to be coated on the outer surface thereof relative to the anode.

24. The apparatus of claim 23 wherein said outlet of said nozzle has a width of between about 0.01 mm to about 1.0 mm.

25. The apparatus of claim 23 further comprising means for adjusting the longitudinal position of the leading edge of the anode relative to the target surface.

26. The apparatus of claim 23 further comprising means for adjusting the flow of gas through said nozzle.

27. Apparatus for localized ion sputtering to coat a predetermined shaped spot on an object to be coated, comprising:

a vacuum chamber;

a planar anode/cathode unit comprising an anode and a cathode disposed in parallel facing relation in said vacuum chamber, said cathode and anode being separated by a layer of dielectric material disposed therebetween, said anode/cathode unit having at least one predetermined shaped opening therein;

a cathode target surface to be sputtered disposed in facing relation beneath the cathode of the anode/cathode unit, said opening being disposed over said cathode target surface;

power supply means for generating an electric field between said anode and said cathode and said cathode target surface;

a plasma forming gas nozzle formed by a space between said cathode of said anode/cathode unit and cathode target surface for directing a stream of plasma forming gas onto a localized area of the target surface immediately adjacent to said predetermined shaped opening for establishing a localized concentration of a plasma forming gas within said localized area, said nozzle being operative for creating an increased localized pressure of said plasma forming gas of between about 60 Pa to about 600 Pa within said localized area;

means for positioning a planar substrate to be spot coated generally parallel to said anode/cathode unit.

28. The apparatus of claim 27 wherein said nozzle has an outlet width of between about 0.01 mm to about 1.0 mm in the area immediately adjacent to the predetermined shaped opening.

29. The apparatus of claim 27 further comprising means for adjusting the flow of gas through said nozzle.

* * * * *